(12) United States Patent
Schoeffmann et al.

(10) Patent No.: US 11,496,127 B2
(45) Date of Patent: Nov. 8, 2022

(54) VOLTAGE MONITORING CIRCUIT AND METHOD FOR MONITORING A VOLTAGE

(71) Applicant: Infineon Technologies AG, Neubiberg (DE)

(72) Inventors: Manuel Schoeffmann, Unterhaching (DE); Christoph Saas, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 17/523,065

(22) Filed: Nov. 10, 2021

(65) Prior Publication Data
US 2022/0149834 A1    May 12, 2022

(30) Foreign Application Priority Data

Nov. 12, 2020   (DE) .......................... 102020129889.7

(51) Int. Cl.
*H03K 17/22*   (2006.01)
*G06F 1/24*   (2006.01)
*H03K 3/03*   (2006.01)
*H03K 19/20*   (2006.01)

(52) U.S. Cl.
CPC ............. *H03K 17/223* (2013.01); *G06F 1/24* (2013.01); *H03K 3/0307* (2013.01); *H03K 19/20* (2013.01)

(58) Field of Classification Search
CPC ................... H03K 5/01; H03K 3/017; H03K 2005/00019; G01R 31/31727
USPC .......................................................... 327/142
See application file for complete search history.

(56) References Cited

U.S. PATENT DOCUMENTS

| | | | | |
|---|---|---|---|---|
| 6,148,418 A | * | 11/2000 | Wang | G06F 1/206 714/25 |
| 6,834,093 B1 | * | 12/2004 | Chiu | G01R 23/005 327/43 |
| 6,980,084 B1 | * | 12/2005 | Yones | G06K 19/0723 340/447 |
| 6,987,406 B1 | * | 1/2006 | Chiu | H03L 7/113 331/11 |
| 2010/0026377 A1 | * | 2/2010 | Weder | G05F 1/561 327/538 |

(Continued)

FOREIGN PATENT DOCUMENTS

DE    19983975 B3    5/2006

OTHER PUBLICATIONS

German Patent Office, Office Action issued for DE 102020129889.7, 5 pgs., dated Dec. 17, 2020.

*Primary Examiner* — Ryan Jager
(74) *Attorney, Agent, or Firm* — Banner & Witcoff Ltd.

(57) ABSTRACT

Voltage monitoring circuit having an analog reset signal generator to generate a reset signal and coupled to a voltage to be monitored; first register to store a first state bit and coupled to the voltage to be monitored; second register connected in parallel to the first register, redundant to the first register, to store a second state bit, and coupled to the voltage to be monitored; logic coupled to the first and second registers and to determine a state control signal from the first and second state bits, and a second reset signal; and OR logic to receive the following signals on the input side and process them with one another according to an OR operation: a first reset signal generated by the analog reset signal generator and the second reset signal, so that a reset control signal is generated and fed to reset inputs of the registers.

17 Claims, 5 Drawing Sheets

(56) References Cited

U.S. PATENT DOCUMENTS

2010/0148744 A1\* 6/2010 Kresse .................. G05F 3/30
 323/313
2022/0149834 A1\* 5/2022 Schoeffmann ......... H03K 19/20

\* cited by examiner

VOLTAGE MONITORING CIRCUIT AND METHOD FOR MONITORING A VOLTAGE

TECHNICAL FIELD

The disclosure relates to a voltage monitoring circuit and a method for monitoring a voltage.

BACKGROUND

Electronic circuits, for example integrated circuits on a chip, can have an idle state as one of their operating modes. Its normal designation as "hibernation mode" identifies it as an ultra-low-energy mode.

The entire chip is typically deactivated, and only a limited number of logic gates which are connected directly to an external voltage supply control the circuit.

The logic gates can form sequential logic elements in order to store different system states, for example a deactivation state and a wake-up state.

During an externally initiated activation procedure, it is essential to perform a correct reset of the sequential elements in any start-up state, since an unwanted state can result in the permanent prevention of a correct start-up of the chip.

A reset must further be triggered in a case where the voltage supply is unstable, for example if "brownouts" (unwanted voltage dips) occur. Logical values can be damaged as a result, for example if logical storage elements are caused to switch from one logic state to another due to voltage fluctuations, possibly resulting in electronic circuit hang-up.

This reset should be triggered with minimal energy consumption in the released state, since the current required for the reset typically dominates the entire current consumption in idle mode.

A reset is presently generated in some cases with a delay, e.g. by using a delay element. As a result, the voltage increase of the voltage supply can used for the pulse generation. This is referred to as dynamic reset generation. This procedure is particularly effective if the voltage is increased in a controlled manner. However, this procedure fails in the case of a voltage which increases slowly, irregularly or in the form of multiple ramps. It may be advantageous that no static current consumption is present, but the requirements are not met in the case of a dynamically varying supply voltage.

In a different procedure that is presently used, the dynamic reset generation is supplemented by an observation/monitoring of the external supply voltage in comparison with transistor threshold values. A static bias current is required for a plurality of paths. Although huge resistances are used in order to limit the currents, the bias currents carry by far the greatest proportion of the current consumption at room temperature.

SUMMARY

In different example embodiments, an integrity of states of an electronic circuit is ensured by using a redundancy in registers in such a way that a probability of an unwanted state occurring is reduced to almost zero. The actual reset generation can be performed in an essentially known manner.

BRIEF DESCRIPTION OF THE DRAWINGS

Example embodiments of the disclosure are shown in the figures and are explained in detail below.

In the drawing.

DETAILED DESCRIPTION

In the following detailed description, reference is made to the attached drawings which form part thereof and in which specific embodiments in which the disclosure can be implemented are shown by way of illustration. In this respect, direction terminology, such as "above", "below", "in front", "behind", "front", "rear", etc., is used in relation to the orientation of the described figure(s). Since components of example embodiments can be positioned in a number of different orientations, the direction terminology serves for illustration and is in no way limiting. Other embodiments can obviously be used and structural or logical modifications can be made without departing the protective scope of the present disclosure. The features of the different example embodiments described herein can be combined with one another, unless specifically indicated otherwise. The following detailed description is therefore not to be interpreted in a limiting sense, and the protective scope of the present disclosure is defined by the attached claims.

In the context of this description, the terms "linked", "connected" and "coupled" are used to describe both a direct and an indirect link, a direct or indirect connection, and a direct or indirect coupling. Identical or similar elements are denoted with identical reference numbers in the figures, insofar as this is appropriate.

Figure 1:
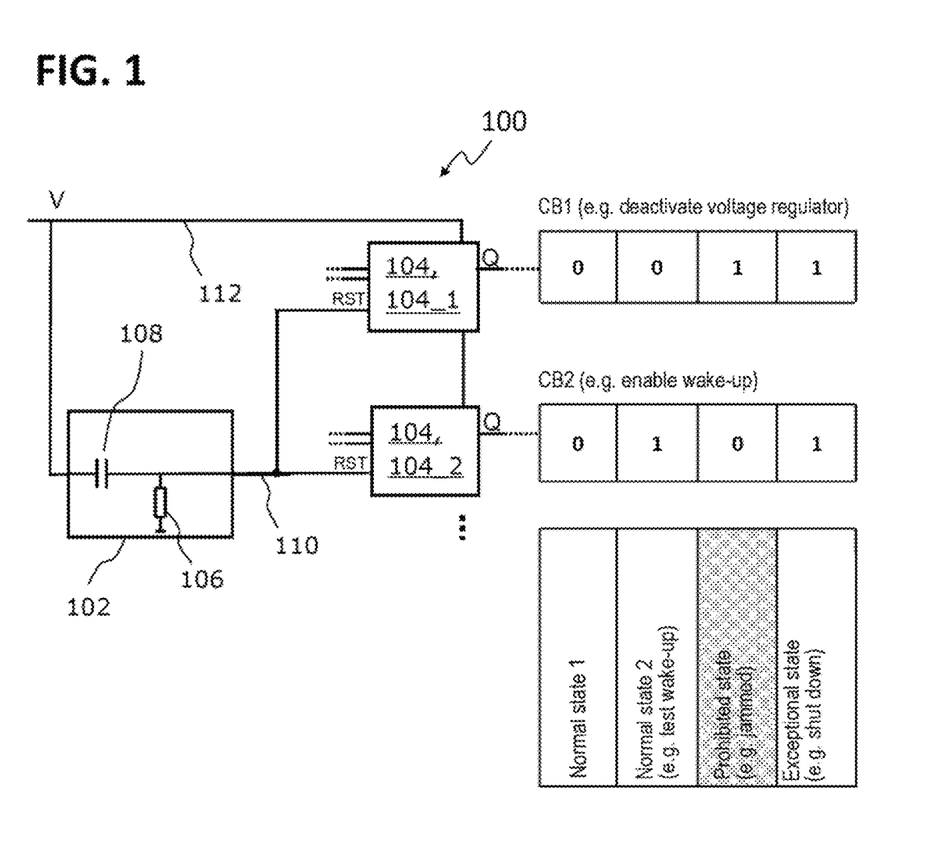
FIG. 1 shows a state determination circuit according to a prior art.

FIG. 1 shows a state determination circuit 100 according to a prior art.

A supply voltage V can be fed to the state determination circuit 100.

At least one circuit element 104 (here, by way of example, two circuit elements 104_1 and 104_2) can be provided in order to define a system state of a circuit component which is connected to the voltage monitoring circuit 100 following an activation, for example a reset, which can be initiated by means of a reset signal generator 102.

A first register, for example, in the first circuit element 104_1 can serve to define whether a voltage regulator which provides the supply voltage V is to be deactivated ("1": yes; "0": no).

Similarly, a second register in the second circuit element 104_2 can serve to define whether a wake-up is to be enabled (following a deactivation) ("1": yes; "0": no).

One possible combination of the stored state definitions which is shown in the right half of FIG. 1, shows a possible problem: if this combination defines that the voltage regulator is to be deactivated, but a wake-up is not to be permitted, the circuit component may remain jammed in an irresolvable state.

Such a combination of state definitions would obviously not be set intentionally, or at most for test purposes. However, one of the registers could, for example in the event of a fluctuation in the supply voltage V, spontaneously switch over in an unwanted manner from one state to the other and thus set the circuit component to an unwanted state.

In different example embodiments, a voltage monitoring circuit or a method for monitoring a voltage is provided which minimizes a probability of a circuit component being set to such an unwanted state.

In different example embodiments, registers can be provided in redundant form for this purpose, so that an incorrect state (e.g. due to a random or unintentional switchover) of one of the registers can be detected, and can be configured to trigger a (new) reset of the registers, i.e. a (new) reset.

In different example embodiments, it is ensured that a circuit component, e.g. a logical block, which can be supplied directly from the (external) voltage monitored by the voltage monitoring circuit can be operated in a stable manner. A voltage supply of this type can have significant fluctuations and dips and/or unexpected behavior when the voltage is increased (e.g. following an activation), so that a correct and reliable performance of a reset, as enabled according to different example embodiments, is essential.

Although reference is made in the described example embodiments primarily to a reset following an activation (power-on reset), the example embodiments can also be used in other ultra-low energy systems in which a provision of a stable voltage is relevant to system integrity, e.g. in other voltage monitoring systems.

In different example embodiments, a plurality N of registers which, in combination, can define $2^N$ states, can be used instead of a single register. Only two of these states can be defined as permitted states (state set or state not set), and the remaining $2^N-2$ states can define inconsistent states which can serve, for example, as a basis for a reset instruction.

In different example embodiments, the redundantly configured registers can be used for both the voltage monitoring and for the definition of system states.

In different example embodiments, the redundantly configured registers can be used exclusively for the voltage monitoring, and additional registers, such as those known from the prior art, can be provided for the definition of system states. In different example embodiments, the registers for the voltage monitoring can be set as more sensitive, i.e. can switch over more easily than the registers for the definition of system states in the event of voltage fluctuations.

Figure 2A:
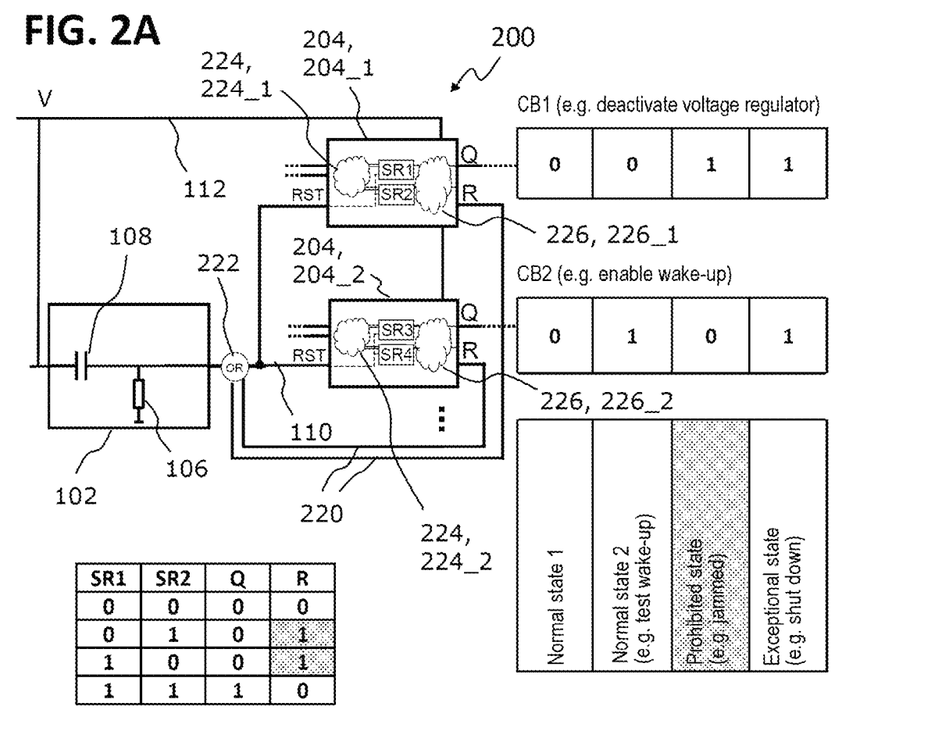
FIG. 2A shows a voltage monitoring circuit according to different example embodiments.
Figure 2B:
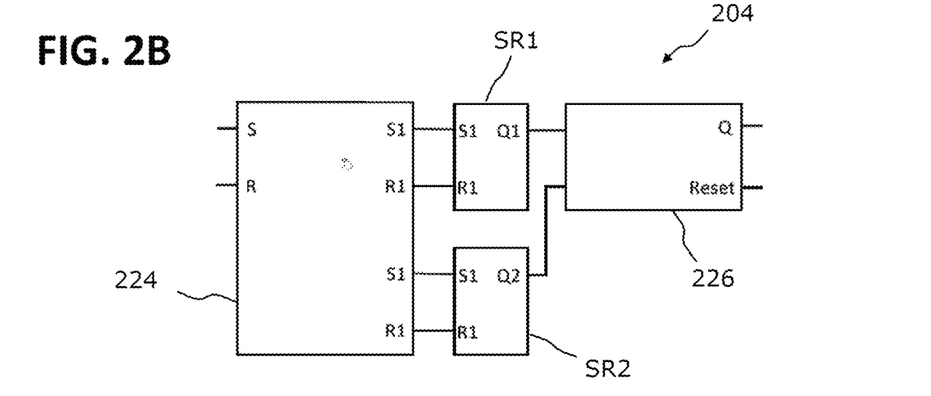
FIG. 2B shows a voltage monitoring element according to different example embodiments.
Figure 3:
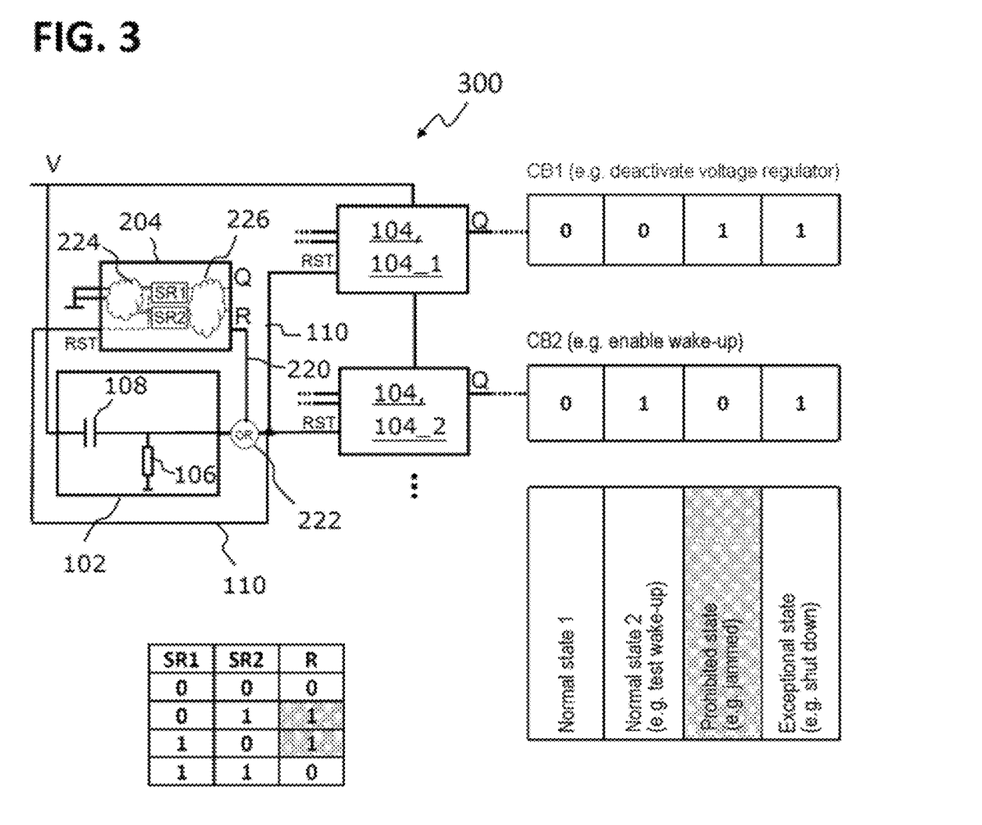
FIG. 3 shows a voltage monitoring circuit according to different example embodiments.

FIG. 2A shows a voltage monitoring circuit 200 according to different example embodiments, FIG. 2B shows a voltage monitoring element 204 according to different example embodiments, and FIG. 3 shows a voltage monitoring circuit 300 according to different example embodiments.

The voltage monitoring circuit 200, 300 can be configured to monitor a supply voltage V for a circuit component (e.g. a logical block) which is coupled (e.g. connected in an electrically conducting manner) to the voltage monitoring circuit 200, 300, for example to ensure that possible voltage fluctuations during an activation procedure do not permanently impair a function of the circuit component.

The voltage monitoring circuit 200, 300 can have an analog reset signal generator 102 which can be coupled to the voltage to be monitored and can be configured to generate a reset signal R. The reset signal generator 102 can be configured, for example, to generate the reset signal R following an activation.

The voltage monitoring circuit 200, 300 can further have a first register SR1 which stores a first state bit, wherein the first register SR1 is coupled to the voltage V to be monitored.

The voltage monitoring circuit 200, 300 can further have a second register SR2 which is connected in parallel to the first register SR1 and is redundant in relation to the first register SR1 and which stores a second state bit, wherein the second register SR2 is similarly coupled to the voltage V to be monitored.

In different example embodiments, the voltage monitoring circuit 200, 300 can have further redundant registers which can be formed in the same or in a similar manner to the first register SR1 and the second register SR2. For example, a total of N registers SR1, SR2, ..., SRN which are redundant in relation to one another can be provided, where N≥2. The N registers can be suitable for defining $2^N$ states in combination.

In different example embodiments, the registers SR1, SR2, ..., SRN can be formed in a manner essentially known for registers, for example as flip-flops, e.g. as clock-edge-controlled flip-flops or as clock-level-controlled flip-flops (e.g. as D or RS latches).

In different example embodiments, the registers SR1, SR2, ..., SRN can be formed in such a way that they provide defined output values for all combinations of set, reset and enable input values, e.g. RS latches with defined states for input values R=S=1. A reliable operation can thus be enabled if the possibility exists for the input values to vary randomly, e.g. due to the fluctuations in the voltage V.

In FIG. 2A to 3 and parts of the description, reference is made to embodiments with two redundant registers SR for the sake of simplicity. These descriptions also apply accordingly to example embodiments with more than two redundant registers SR1, SR2, ..., SRN.

In different example embodiments, the voltage monitoring circuit 200, 300 can further have a logic 226 which is coupled to the first register SR1 and to the second register SR2, e.g. on the output side, and a second reset signal R can be determined from the first state bit and the second state bit. In FIG. 2A, the logic 226 coupled to the first register SR1 and to the second register SR2 is additionally denoted by the reference number 226_1 in order to distinguish it from a second logic 226, 226_2 which (as described below) is coupled to a third register SR3 and to a fourth register SR4. However, the logic 226_1 and the second logic 226_2 can be functionally identical, unless otherwise described.

If it is determined that the first state bit and the second state bit contain non-redundant information, the logic 226 can be configured to output the second reset signal R with a first value (e.g. "1") which results in a reset of the registers SR1, SR2, ..., SRN. If it is determined that the first state bit and the second state bit contain redundant information, the logic 226 can further be configured to output the second reset signal R with a second value (e.g. "0") which does not result in a reset of the registers SR1, SR2, ..., SRN.

The term "redundant" is to be understood here to mean that the logic 226 is configured to define only two of the $2^N$ states as permitted states (e.g. as "state set" or "state not set"), and to define the remaining $2^N-2$ states as inconsistent states. This means that it is not necessary (but is possible) for all redundant registers SR1, SR2, ..., SRN to be in the same switching state.

In FIG. 2A, the table under the diagram shows the determination of consistent and inconsistent states for the case where N=2. The logic 226 is configured in such a way that it only classifies states in which the first register SR1 and the second register SR2 have stored state bits with the same bit value, i.e. are in the same switching state, as consistent states.

This is shown in the table in that, in the case where both SR1 and SR2 have the value "0" and in the case where both SR1 and SR2 have the value "1", the value "0" is recorded in the column "R" which designates the second reset signal provided by the logic 226. In other words, no reset is required by the logic 226 in the case of identical stored bit values in SR1 and SR2.

In the case where SR1 has the value "0" and SR2 has the value "1", or vice versa, the value "1" is recorded in the column "R". In other words, a reset is required by the logic 226 in the case of differing stored bit values in SR1 and SR2.

In different example embodiments, the logic 226 can be configured to classify those cases in which SR1 and SR2 contain opposite bit values as the stored state bits as the consistent states, and, in cases where SR1 and SR2 have the same bit values as the stored bit values, i.e. both "0" or both "1", to trigger a reset.

A definition of the consistent states as state bits with different bit values can be advantageous in different example embodiments in which a stability of a set state of a register SR1, SR2, . . . , SRN depends on the stored bit value. A situation can thus be prevented or hindered in which all N registers SR1, SR2, . . . , SRN switch over simultaneously due to a mutually similar sensitivity to voltage fluctuations and therefore suggest a consistent (and therefore valid) state, but which is nevertheless incorrect.

In the case of a sensitivity which depends on the stored bit value, initially (or indeed only) one of the two registers SR1, SR2 could switch over if a voltage fluctuation occurs, resulting in an inconsistent state and triggering a reset.

As already mentioned, the inconsistent states can serve as a basis for a reset instruction.

In different example embodiments, the bit-value-dependent sensitivity, in other words the switchover probability of the registers SR1, SR2 which is asymmetrical in relation to the reset and set state, can be set in a targeted manner so that the more probable (more stable) combined state of the first register SR1 and of the second register SR2 is the consistent state (resulting in a more robust system), or is the inconsistent state (resulting in an easier triggering of the reset).

The generation of the reset instruction when an inconsistent state occurs can be implemented, for example, in such a way that an OR logic 222 is provided in the voltage monitoring circuit 200, 300 and receives a first reset signal generated by the analog reset signal generator 102 and the second reset signal on the input side and processes them with one another according to an OR operation so that a reset control signal RST is generated.

The reset control signal RST can be fed to reset inputs of the registers SR1, SR2, . . . , SRN and, if necessary, can perform a reset of the registers SR1, SR2, . . . , SRN.

In different example embodiments, the voltage monitoring circuit 200, 300 can have a filter which is configured to activate the logic 226 only if the storage of the first state bit and the second state bit is completed. In other words, the filter can be configured to delay the execution of the logic 226 until it is ensured that all redundant registers SR1, SR2, . . . , SRN have been written to. Otherwise, a write process that has not yet been performed could result in the state bits stored in the registers SR1, SR2, . . . , SRN being evaluated as inconsistent and a reset been triggered.

The filtering can be combined with successive steps of registers since a defined pulse length and error-free logic states at the input generate error-free logic at the output insofar as time restrictions are observed.

Depending on the type of filters that are used, the filters can themselves generate a dynamic reset, since internal nodes with a high capacitive load can implement trigger thresholds with a delay such that a reset state is generated.

A different possibility for ensuring a consistent writing of the redundant registers SR1, SR2, . . . , SRN can be provided by means of signal handshaking, i.e. a software-controlled simultaneous register state change (or within a time window which does not yet result in the inconsistent evaluation).

The voltage monitoring circuit 200, 300 with the filter can thus be operable asynchronously, i.e. without provision of a clock, thus being particularly energy-saving, and nevertheless error-free.

In different example embodiments, e.g. alternatively or in addition to the filter, a clock signal can be provided in order to synchronize the writing of the redundant registers SR1, SR2, . . . , SRN.

In different example embodiments, all registers SR1, SR2, . . . , SRN of the voltage monitoring circuit 200, 300, not only those in which an inconsistency is determined, can be reset.

In different example embodiments, e.g. in the voltage monitoring circuit 200, the logic 226 can be configured to determine a state control signal Q from the first state bit SR1 and the second state bit SR2.

The state control signal Q can serve to define a state of at least one circuit component.

In different example embodiments, the state control signal Q in the voltage monitoring circuit 200 can be provided with a higher reliability than in the prior art. As shown in the table in FIG. 2A, the logic 226 can be configured so that Q has the value which can possibly result in an unwanted state (in the example from FIG. 2A, this would be the value 1 for the state control signal Q in connection with "deactivate voltage regulator") only if both (or all) redundant registers SR1, SR2, . . . , SRN consistently produce this value. In the table, Q=1 applies accordingly only if both SR1 and SR2 have the value 1. In the case of the inconsistent combination 0/1 and the consistent combination 0/0 for SR1 and SR2, Q=0 is assigned and output by the logic 226.

As described above in connection with the prior art, the state control signal Q can be the original cause for the provision of the registers SR1, SR2, . . . , SRN in the voltage monitoring circuit 200, i.e. the registers SR1, SR2, . . . , SRN can be classified as data registers. These data registers can be employed in the voltage monitoring circuit 200 for a secondary use as voltage monitoring registers in that the state bits which are stored in the registers SR1, SR2, . . . , SRN which are redundant in relation to one another are used not only to define the state of the circuit component, but also to generate the reset signal when inconsistencies occur.

In different example embodiments, it may suffice to provide redundant registers SR1, SR2, . . . , SRN for only some of the state bits, for example only for state bits which are relevant for defining states of the circuit component which can result in a dangerous or irretrievable state in the case of an incorrect memory value (e.g. as a result of a switchover due to an incorrect voltage V).

In different example embodiment, other state bits, for example those which serve merely to define uncritical states of the circuit component, can be stored in registers without redundancy. These state bits can also be reset in the event of a reset triggered by the redundant registers SR1, SR2, . . . , SRN.

In different example embodiments, supplementary redundant registers can further be provided which are not used to generate a state control signal Q, but are configured purely to monitor the voltage V, whereby the logic 226 is configured to determine, for the supplementary redundant registers also, whether the state values stored in them are redundant in relation to one another and are therefore consistent or inconsistent. If inconsistency is determined, the logic 226 can be configured to generate the second reset signal.

Alternatively or additionally, one or more of the redundant registers SR1, SR2, . . . , SRN can be configured to generate the state control signal Q, but the latter can, at least in some states of the circuit component, ignore the state control signal of these redundant registers. These registers then also serve only for the voltage monitoring.

In different example embodiments, the voltage monitoring circuit 200, 300 can further have an additional logic 224, 224_1 which can be coupled to the first register SR1 and to the second register SR2 (e.g. on the input side). The description set out above for the relationship of the logic 226_1 and the second logic 226_2 applies accordingly to the additional logic 224_1 and the second additional logic 224_2.

The additional logic 224 can be configured to feed memory data S and reset signals R to the first register SR1 and to the second register SR2, as shown by way of example in FIG. 2B.

In different example embodiments, the additional logic 224 can be configured to feed memory data S to the first register SR1 and to the second register SR2, and the reset signals R can be fed directly, i.e. without using the logic 224, to the first register SR1 and to the second register SR2, as shown by way of example in FIG. 2A (and FIG. 3 which is explained below).

The redundant registers SR1, SR2, . . . , SRN, together with the logic 226 and the additional logic 224, can be designated as the voltage monitoring element 204, 204_1.

In different example embodiments, the voltage monitoring circuit 200, 300 can further have a second voltage monitoring element 204, 204_2 which can be formed in a manner similar to the first voltage monitoring element 204, 204_1.

The voltage monitoring circuit 200, 300 can have a third register SR3 which stores a third state bit, wherein the third register is coupled to the voltage to be monitored, and a fourth register SR4 which is connected in parallel to the third register SR3 and is redundant in relation to the third register SR3 and which stores a fourth state bit, wherein the fourth register SR4 is coupled to the voltage to be monitored.

The description set out above for the first register SR1 applies to the third register SR3 and its use. The description set out above for the second register SR2 similarly applies to the fourth register SR4 and its use and, in particular, the description set out above for the use of the first register SR1 and the second register SR2 in combination applies to the third register SR3 and to the fourth register SR4.

The voltage monitoring circuit 200, 300 can further have a second logic 226_2 which is coupled to the third register SR3 and to the fourth register SR4 and which determines a second state control signal Q and further a third reset signal R from the third state bit and the fourth state bit.

The voltage monitoring circuit 200, 300 can further be configured to feed the third reset signal R to the OR logic on the input side, and the OR logic can be configured to incorporate the third reset signal R in the processing of the first reset signal and the second reset signal R according to the OR operation.

In different example embodiments, the voltage monitoring circuit 200, 300 can further have at least one additional voltage monitoring element 204 which can be formed in a manner similar to the first or second voltage monitoring element 204_1, 204_2 and can be configured accordingly to determine at least one additional reset signal R and at least one additional state control signal Q which are processed in a manner similar to the second and third reset signal R or the state control signals Q. This is indicated in FIG. 2A by the vertical "ellipsis dots" below the voltage monitoring element 204_2.

The first state control signal and the second (and possibly the at least one additional) state control signal can be configured to define states of different circuit components or different state aspects of the same circuit component.

As shown by way of example in FIG. 2A, the first state control signal can be configured to define a deactivation state of the voltage regulator, i.e. a "1" can define a state in which the voltage regulator is or becomes deactivated.

The second state control signal can be configured to define whether a wake-up of the circuit component is enabled. Here, a "1" can represent an enablement of the wake-up.

In different example embodiments, the state control signal and the second state control signal can jointly define a state of at least one circuit component. A combination of "do not deactivate, no wake-up", for example, can represent a normal operational state, a combination of "do not deactivate, but enable wake-up" can represent a normal operation with test wake-up, and "deactivate, but enable wake-up" can represent a (normal) deactivation operational state.

As already mentioned above, the combination of "deactivate, but do not wake up" could result in a permanent deactivation, but this state would not be deliberately programmed and an inadvertent setting would be improbable in different example embodiments, in particular due to the increased reliability explained above in the assignment of values for Q and the initiation of a reset in the case of inconsistent values in the redundant registers SR1, SR2, . . . , SRN.

The voltage monitoring circuit 300 from FIG. 3 differs from the voltage monitoring circuit 200 from FIG. 2A particularly in that the registers SR1, SR2, . . . , SRN configured redundantly in relation to one another (or for redundant use) are used merely to generate the second reset signal R and not additionally to generate the state control signal Q.

In other words, the registers SR1, SR2, . . . , SRN are not data registers, but merely voltage monitoring registers.

This means that, in different example embodiments, the logic 226 is configured to generate only the second reset signal R (i.e. not to generate the state control signal Q). In other example embodiments, the logic 226 can be configured to generate the state control signal Q also, but not to output it or at least not to use it to define the state of the circuit component.

Registers 104, such as those known from the prior art, for example, can be provided to generate the state control signal Q.

In different example embodiments, the voltage monitoring circuit 300 can accordingly have an analog reset signal generator 102 which is configured to generate a reset signal, wherein the analog reset signal generator 102 is coupled to a voltage V to be monitored, a first register SR1 which stores a first state bit, wherein the first register SR1 is coupled to the voltage V to be monitored, a second register SR2 which is connected in parallel to the first register SR1 and is redundant in relation to the first register SR 1 and which stores a second state bit, wherein the second register is coupled to the voltage to be monitored, and a logic 226 which is coupled to the first register SR1 and to the second register SR2 and which determines a second reset signal R from the first state bit and the second state bit.

The voltage monitoring circuit 300 can further have at least one state register 104, 104_1, 104_2 which stores at least one additional state bit and generates at least one state control signal Q, wherein the at least one state register 104, 104_1, 104_2 is coupled to the voltage V to be monitored.

The voltage monitoring circuit 300 can further have an OR logic which receives the following signals on the input side and processes them with one another according to an OR operation: a first reset signal generated by the analog reset signal generator 102 and the second reset signal R, so that a reset control signal RST is generated and is fed to reset inputs of the registers SR1, SR2, . . . , SRN and of the at least one state register 104.

In different example embodiments, all registers SR1, SR2, . . . , SRN, 104 are reset in the voltage monitoring circuit 300 if an inconsistency is determined by means of the redundant registers SR1, SR2, . . . , SRN.

In different example embodiments, the voltage monitoring circuit 300 can be advantageously designed particularly if a switchover probability of the first register SR1 and/or the second register SR2 in the event of an irregularity of the voltage V to be monitored is higher than a switchover probability of the at least one state register 104.

This means that the registers SR1, SR2, . . . , SRN undergo a spontaneous switchover of bits due to the voltage fluctuations resulting in an inconsistency and therefore a reset, even if the state registers 104 are still unimpaired.

In different example embodiments, the switchover probability of the first register SR1 and/or the second register SR2 can be set by means of their input assignment as higher than the switchover probability of the at least one state register 104.

In different example embodiments, the type of the registers SR1, SR2, . . . , SRN can alternatively or additionally be chosen in such a way that they respond more sensitively to voltage fluctuations than the state registers 104.

In different example embodiments, non-transparent registers SR1, SR2, . . . , SRN can be used in which the state does not change with the input signal (e.g. a D latch in which the "enable" signal is 0).

However, in such a case, the bit value of the fed in input value can have an influence on the switchover probability of the register SR1, SR2, . . . , SRN so that the fed in input value can be deliberately chosen in such a way that a desired behavior of the voltage monitoring circuit 200, 300 is achieved overall.

For a sensitive or simple/early reset generation, for example, the bit values of the input signals can be configured in such a way that they are the opposite of the stored bit values if the registers SR1, SR2, . . . , SRN are in the non-transparent state, since a switchover probability and therefore a detection of a reset requirement can thus be increased.

In different example embodiments, the voltage monitoring circuit 200, 300 can further have an additional voltage monitoring circuit of the type described in connection with the prior art, e.g. to compare the supply voltage V by means of transistors with a limit value with the aid of a bias current. In different example embodiments, the voltage monitoring circuit 200, 300 and/or the additional voltage monitoring circuit can in each case be used in only a limited number of operational states. The voltage monitoring circuit 200, 300 can, for example, be used only during the idle state and/or during the activation.

In different example embodiments, inconsistent states of the registers SR1, SR2, . . . , SRN can possibly be at least temporarily acceptable, for example in connection with applications which require no correct values. It may be unnecessary, for example, to ensure a correct state control signal Q in respect of a wake-up from the idle state if the circuit component or the chip is not in the idle state at all or is not currently switching to the idle state, and would therefore itself be an incorrect wake-up state control signal without consequences. In such a case, the assigned registers can be set to fixed values or can be switched to a non-transparent state, e.g., in the example mentioned, while the circuit component or the chip is not in the idle state.

Figure 4:
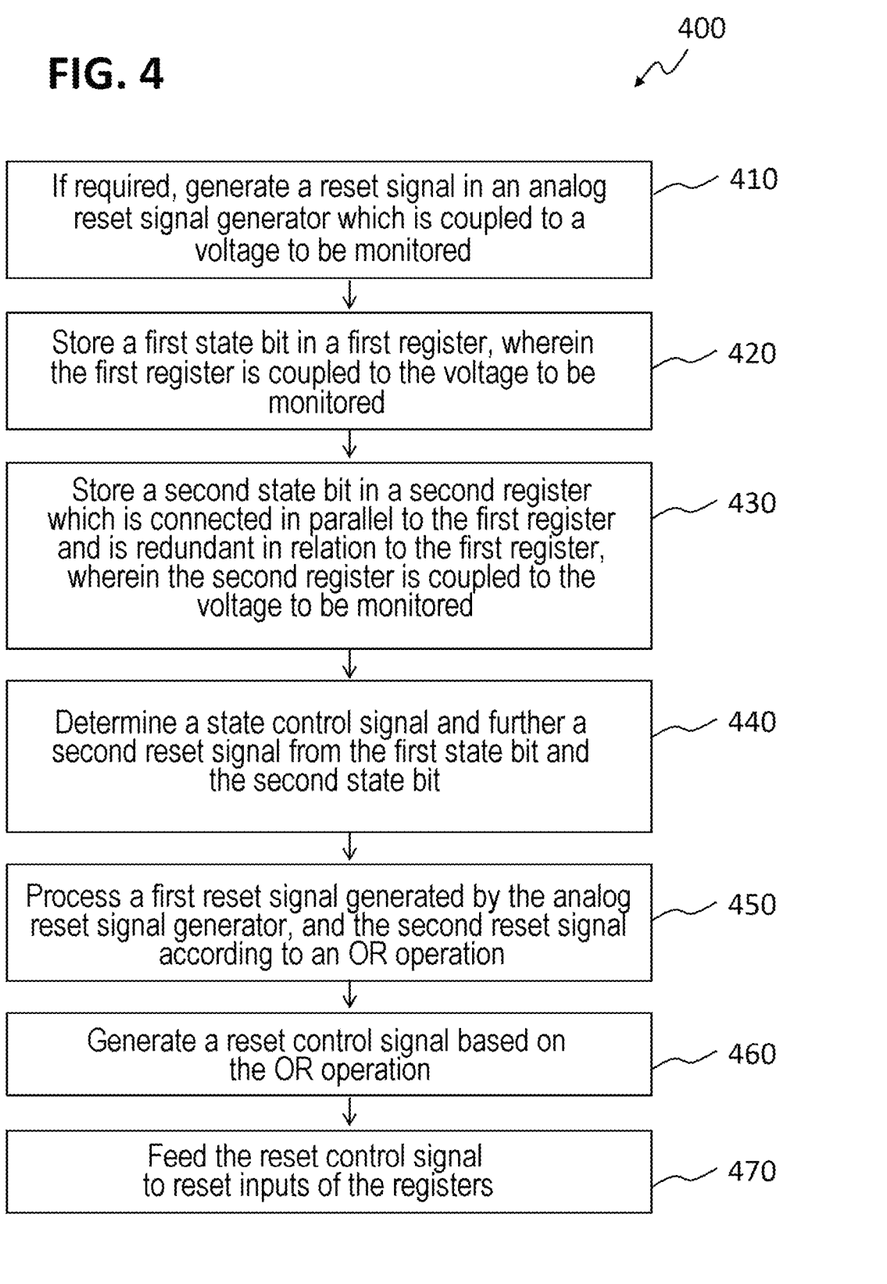
FIG. 4 shows a flow diagram of a method for monitoring a voltage.

FIG. 4 is a flow diagram 400 of a method for monitoring a voltage.

The method for monitoring a voltage comprises, if required, generating a reset signal in an analog reset signal generator which is coupled to a voltage to be monitored (at 410).

The method further comprises storing a first state bit in a first register, wherein the first register is coupled to the voltage to be monitored (at 420), storing a second state bit in a second register which is connected in parallel to the first register and is redundant in relation to the first register, wherein the second register is coupled to the voltage to be monitored (at 430), determining a state control signal and further a second reset signal from the first state bit and the second state bit (at 440), processing a first reset signal generated by the analog reset signal generator and the second reset signal according to an OR operation (at 450), generating a reset control signal based on the OR operation (at 460), and feeding the reset control signal to reset inputs of the registers (at 470).

Figure 5:
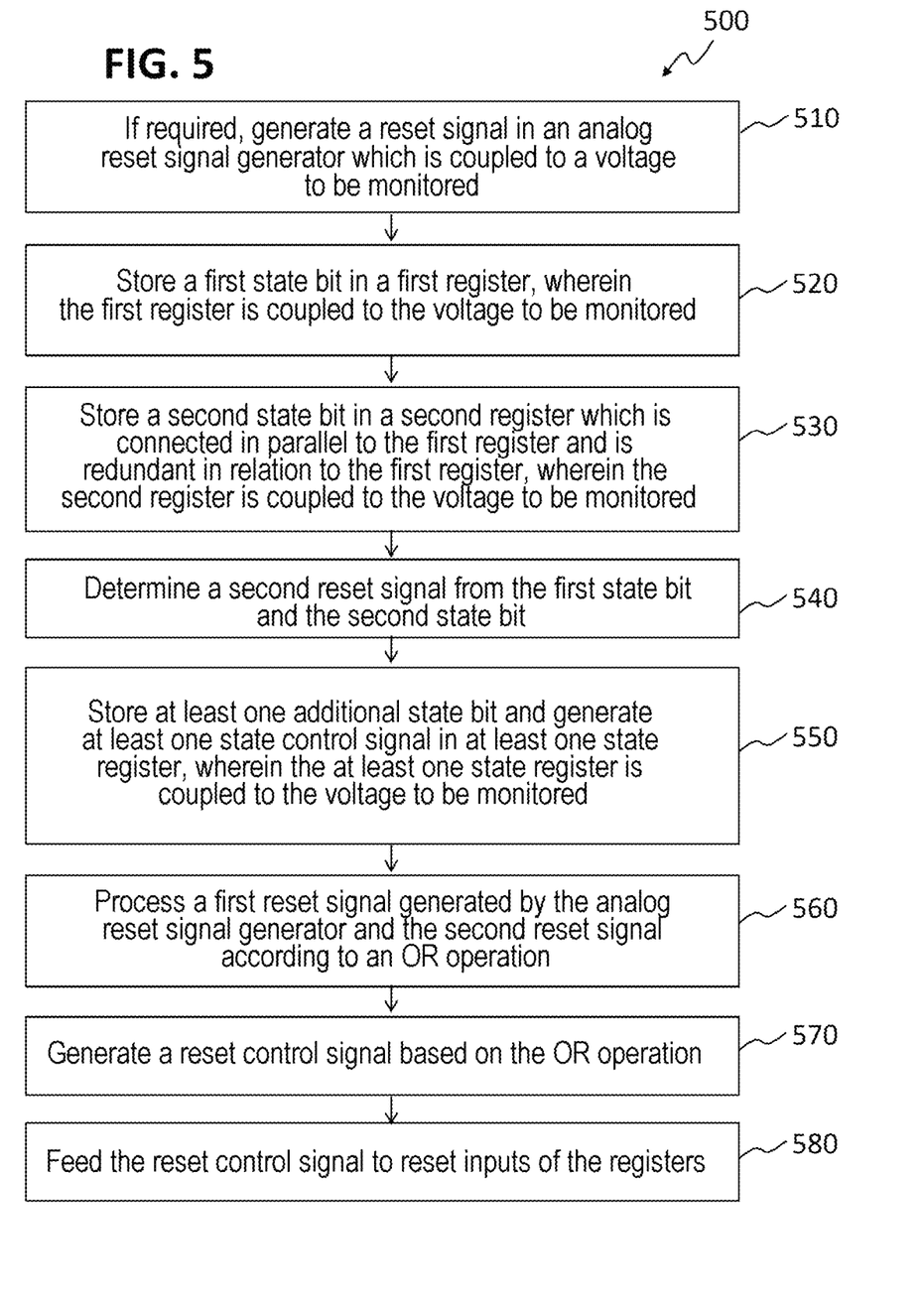
FIG. 5 shows a flow diagram of a method for monitoring a voltage.

FIG. 5 is a flow diagram 500 of a method for monitoring a voltage.

The method for monitoring a voltage comprises, if required, generating a reset signal in an analog reset signal generator which is coupled to a voltage to be monitored (at 510).

The method further comprises storing a first state bit in a first register, wherein the first register is coupled to the voltage to be monitored (at 520), storing a second state bit in a second register which is connected in parallel to the first register and is redundant in relation to the first register, wherein the second register is coupled to the voltage to be monitored (at 530), determining a second reset signal from the first state bit and the second state bit (at 540), storing at least one additional state bit and generating at least one state control signal in at least one state register, wherein the at least one state register is coupled to the voltage to be monitored (at 550), processing a first reset signal generated by the analog reset signal generator and the second reset signal according to an OR operation (at 560), generating a reset control signal based on the OR operation (at 570), and feeding the reset control signal to reset inputs of the registers (at 580).

To summarize, some example embodiments are indicated below.

Example embodiment 1 is a voltage monitoring circuit having an analog reset signal generator, configured to generate a reset signal, wherein the analog reset signal generator is coupled to a voltage to be monitored, a first register which stores a first state bit, wherein the first register is coupled to the voltage to be monitored, a second register which is connected in parallel to the first register and is redundant in relation to the first register and which stores a second state bit, wherein the second register is coupled to the voltage to be monitored, a logic which is coupled to the first register and to the second register and which determines a state control signal from the first state bit and the second state bit, and further determines a second reset signal, and an OR logic which receives the following signals on the input side and processes them with one another according to an OR operation: a first reset signal generated by the analog reset signal generator and the second reset signal, so that a reset control signal is generated and fed to reset inputs of the registers.

Example embodiment 2 is a voltage monitoring circuit 1 according to example embodiment 1, wherein the state control signal defines a state of at least one circuit component.

Example embodiment 3 is a voltage monitoring circuit according to example embodiment 1 or 2, wherein the voltage monitoring circuit is configured to store the first state bit and the second state bit as redundant information.

Example embodiment 4 is a voltage monitoring circuit according to example embodiment 3, wherein the logic is configured, on determining that the first state bit and the second state bit contain non-redundant information, to output the second reset signal with a first value which results in a reset of the registers.

Example embodiment 5 is a voltage monitoring circuit according to example embodiment 4, wherein the logic is configured, on determining that the first state bit and the second state bit contain redundant information, to output the second reset signal with a second value which does not result in a reset of the registers.

Example embodiment 6 is a voltage monitoring circuit according to one of example embodiments 1 to 5, wherein the first register and the second register are configured to store the first state bit with the same bit value as the second state bit.

Example embodiment 7 is a voltage monitoring circuit according to one of example embodiments 1 to 5, wherein the first register and the second register are configured to store the first state bit with a bit value opposite to the second state bit.

Example embodiment 8 is a voltage control circuit according to example embodiment 7, wherein a switchover probability of the first register and/or the second register in the event of an irregularity of the voltage to be monitored differs depending on the stored bit value.

Example embodiment 9 is a voltage monitoring circuit according to one of example embodiments 1 to 7, which further has a third register which stores a third state bit, wherein the third register is coupled to the voltage to be monitored, a fourth register which is connected in parallel to the third register and is redundant in relation to the third register and which stores a fourth state bit, wherein the fourth register is coupled to the voltage to be monitored, a second logic which is coupled to the third register and to the fourth register and which determines a second state control signal and further a third reset signal from the third state bit and the fourth state bit, wherein the voltage monitoring circuit is further configured to feed the third reset signal to the OR logic on the input side, and wherein the OR logic is configured to incorporate the third reset signal in the processing of the first reset signal and the second reset signal according to the OR operation.

Example embodiment 10 is a voltage monitoring circuit according to example embodiment 9, wherein the state control signal and the second state control signal jointly define a state of at least one circuit component.

Example embodiment 11 is a voltage monitoring circuit according to one of example embodiments 1 to 10, wherein the registers are formed by flip-flops which are optionally level-controlled.

Example embodiment 12 is a voltage monitoring circuit according to one of example embodiments 1 to 11 which further has a filter which is configured to activate the logic only if the storage of the first state bit and the second state bit is completed.

Example embodiment 13 is a voltage monitoring circuit having an analog reset signal generator, configured to generate a reset signal, wherein the analog reset signal generator is coupled to a voltage to be monitored, a first register which stores a first state bit, wherein the first register is coupled to the voltage to be monitored, a second register which is connected in parallel to the first register and is redundant in relation to the first register and which stores a second state bit, wherein the second register is coupled to the voltage to be monitored, a logic which is coupled to the first register and to the second register and which determines a second reset signal from the first state bit and the second state bit, at least one state register which stores at least one additional state bit and generates at least one state control signal, wherein the at least one state register is coupled to the voltage to be monitored, and an OR logic which receives the following signals on the input side and processes them with one another according to an OR operation: a first reset signal generated by the analog reset signal generator and the second reset signal, so that a reset control signal is generated and fed to reset inputs of the registers and of the at least one state register.

Example embodiment 14 is a voltage monitoring circuit according to example embodiment 13, wherein the state control signal defines a state of at least one circuit component.

Example embodiment 15 is a voltage monitoring circuit according to example embodiment 13 or 14, wherein the voltage monitoring circuit is configured to store the first state bit and the second state bit as redundant information.

Example embodiment 16 is a voltage monitoring circuit according to example embodiment 15, wherein the logic is configured, on determining that the first state bit and the second state bit contain non-redundant information, to output the second reset signal with a first value which results in a reset of the registers.

Example embodiment 17 is a voltage monitoring circuit according to example embodiment 15 or 16, wherein the logic is configured, on determining that the first state bit and the second state bit contain redundant information, to output the second reset signal with a second value which does not result in a reset of the registers.

Example embodiment 18 is a voltage monitoring circuit according to one of example embodiments 13 to 17, wherein the first register and the second register are configured to store the first state bit with the same bit value as the second state bit.

Example embodiment 19 is a voltage monitoring circuit according to one of example embodiments 13 to 18, wherein the first register and the second register are configured to store the first state bit with a bit value opposite to the second state bit.

Example embodiment 20 is a voltage monitoring circuit according to example embodiment 19, wherein a switchover probability of the first register and/or the second register in the event of an irregularity of the voltage to be monitored differs depending on the stored bit value.

Example embodiment 21 is a voltage monitoring circuit according to one of example embodiments 13 to 20, wherein a switchover probability of the first register and/or the second register in the event of an irregularity of the voltage to be monitored is higher than a switchover probability of the at least one state register.

Example embodiment 22 is a voltage monitoring circuit according to example embodiment 21, wherein the switchover probability of the first register and/or the second register is set by means of their input assignment as higher than the switchover probability of the at least one state register.

Example embodiment 23 is a voltage monitoring circuit according to one of example embodiments 13 to 22, which further has a third register which stores a third state bit, wherein the third register is coupled to the voltage to be monitored, a fourth register which is connected in parallel to the third register and is redundant in relation to the third register and which stores a fourth state bit, wherein the fourth register is coupled to the voltage to be monitored, and has a second logic which is coupled to the third register and to the fourth register and which determines a third reset signal from the third state bit and the fourth state bit, wherein the voltage monitoring circuit is further configured to feed the third reset signal to the OR logic on the input side, and wherein the OR logic is configured to incorporate the third reset signal in the processing of the first reset signal and the second reset signal according to the OR operation.

Example embodiment 24 is a voltage monitoring circuit according to one of example embodiments 13 to 23, wherein the at least one state control signal has a plurality of state control signals which jointly define a state of at least one circuit component.

Example embodiment 25 is a voltage monitoring circuit according to one of example embodiments 13 to 24, wherein the registers and/or the at least one state register are formed by flip-flops which are optionally level-controlled.

Example embodiment 26 is a voltage monitoring circuit according to one of example embodiments 13 to 25 which further has a filter which is configured to activate the logic only if the storage of the first state bit and the second state bit is completed.

Example embodiment 27 is a method for monitoring a voltage which comprises, if required, generating a reset signal in an analog reset signal generator which is coupled to a voltage to be monitored, and further storing a first state bit in a first register, wherein the first register is coupled to the voltage to be monitored, storing a second state bit in a second register which is connected in parallel to the first register and is redundant in relation to the first register, wherein the second register is coupled to the voltage to be monitored, determining a state control signal and further a second reset signal from the first state bit and the second state bit, processing a first reset signal generated by the analog reset signal generator and the second reset signal according to an OR operation, generating a reset control signal based on the OR operation, and feeding the reset control signal to reset inputs of the registers.

Example embodiment 28 is a method according to example embodiment 27, wherein the state control signal defines a state of at least one circuit component.

Example embodiment 29 is a method according to example embodiment 27 or 28, wherein the first state bit and the second state bit are stored as redundant information.

Example embodiment 30 is a method according to example embodiment 29, further comprising, on determining that the first state bit and the second state bit contain non-redundant information, outputting the second reset signal with a first value which results in a reset of the registers.

Example embodiment 31 is a method according to example embodiment 29 or 30, further comprising, on determining that the first state bit and the second state bit contain redundant information, outputting the second reset signal with a second value which does not result in a reset of the registers.

Example embodiment 32 is a method according to one of example embodiments 27 to 31 which further comprises storing the first state bit with the same bit value as the second state bit.

Example embodiment 33 is a method according to one of example embodiments 27 to 31 which further comprises storing the first state bit with a bit value opposite to the second state bit.

Example embodiment 34 is a method according to example embodiment 33, wherein a switchover probability of the first register and/or the second register in the event of an irregularity of the voltage to be monitored further differs depending on the stored bit value.

Example embodiment 35 is a method according to one of example embodiments 27 to 34 which further comprises storing a third state bit in a third register, wherein the third register is coupled to the voltage to be monitored, storing a fourth state bit in a fourth register which is connected in parallel to the third register and is redundant in relation to the third register, wherein the fourth register is coupled to the voltage to be monitored, determining a second state control signal and further a third reset signal from the third state bit and the fourth state bit, and incorporating the third reset signal in the processing of the first reset signal and the second reset signal according to the OR operation.

Example embodiment 36 is a method according to example embodiment 35, wherein the state control signal and the second state control signal jointly define a state of at least one circuit component.

Example embodiment 37 is a method according to one of example embodiments 27 to 36, wherein the registers are formed by flip-flops which are optionally level-controlled.

Example embodiment 38 is a method according to one of example embodiments 27 to 37 which further comprises delaying the determination of the state control signal and the second reset signal until the storage of the first state bit and the second state bit is completed.

Example embodiment 39 is a method for monitoring a voltage which comprises, if required, generating a reset signal in an analog reset signal generator which is coupled to a voltage to be monitored, and further storing a first state bit in a first register, wherein the first register is coupled to the voltage to be monitored, storing a second state bit in a second register which is connected in parallel to the first register and is redundant in relation to the first register, wherein the second register is coupled to the voltage to be monitored, determining a second reset signal from the first state bit and the second state bit, storing at least one additional state bit and generating at least one state control signal in at least one state register, wherein the at least one state register is coupled to the voltage to be monitored, and processing a first reset signal generated by the analog reset signal generator and the second reset signal according to an OR operation, generating a reset control signal based on the OR operation and feeding the reset control signal to reset inputs of the registers and of the at least one state register.

Example embodiment 40 is a method according to example embodiment 39, wherein the state control signal defines a state of at least one circuit component.

Example embodiment 41 is a method according to example embodiment 39 or 40, wherein the first state bit and the second state bit are stored as redundant information.

Example embodiment 42 is a method according to example embodiment 41, further comprising, on determining that the first state bit and the second state bit contain non-redundant information, outputting the second reset signal with a first value which results in a reset of the registers.

Example embodiment 43 is a method according to example embodiment 41 or 42, further comprising, on determining that the first state bit and the second state bit contain redundant information, outputting the second reset signal with a second value which does not result in a reset of the registers.

Example embodiment 44 is a method according to one of example embodiments 39 to 43 which further comprises storing the first state bit with the same bit value as the second state bit.

Example embodiment 45 is a method according to one of example embodiments 39 to 44 which further comprises storing the first state bit with a bit value opposite to the second state bit.

Example embodiment 46 is a method according to example embodiment 45, wherein a switchover probability of the first register and/or the second register in the event of an irregularity of the voltage to be monitored differs depending on the stored bit value.

Example embodiment 47 is a method according to one of example embodiments 39 to 46, wherein a switchover probability of the first register and/or the second register in the event of an irregularity of the voltage to be monitored is higher than a switchover probability of the at least one state register.

Example embodiment 48 is a method according to example embodiment 47, wherein the switchover probability of the first register and/or the second register is set by means of their input assignment as higher than the switchover probability of the at least one state register.

Example embodiment 49 is a method according to one of example embodiments 39 to 48 which further comprises storing a third state bit in a third register, wherein the third register is coupled to the voltage to be monitored, storing a fourth state bit in a fourth register which is connected in parallel to the third register and is redundant in relation to the third register, wherein the fourth register is coupled to the voltage to be monitored, determining a second state control signal and further a third reset signal from the third state bit and the fourth state bit, and incorporating the third reset signal in the processing of the first reset signal and the second reset signal according to the OR operation.

Example embodiment 50 is a method according to one of example embodiments 39 to 49, wherein the at least one state control signal has a plurality of state control signals which jointly define a state of at least one circuit component.

Example embodiment 51 is a method according to one of example embodiments 39 to 50, wherein the registers and/or the at least one state register are formed by flip-flops which are optionally level-controlled.

Example embodiment 52 is a method according to one of example embodiments 39 to 43 which further comprises delaying the determination of the state control signal and the second reset signal until the storage of the first state bit and the second state bit is completed.

Further advantageous designs of the device are set out in the description of the method and vice versa.

The invention claimed is:

1. A voltage monitoring circuit, comprising:
an analog reset signal generator configured to generate a reset signal, and coupled to a voltage to be monitored;
a first register configured to store a first state bit, and coupled to the voltage to be monitored;
a second register connected in parallel to the first register, redundant in relation to the first register, configured to store a second state bit, and coupled to the voltage to be monitored;
a logic coupled to the first register and to the second register and configured to determine, from the first state bit and the second state bit, a first state control signal and a second reset signal; and
an OR logic configured to receive the following signals on the input side and process them with one another according to an OR operation: a first reset signal generated by the analog reset signal generator, and the second reset signal so that a reset control signal is generated and fed to reset inputs of the registers.

2. The voltage monitoring circuit as claimed in claim 1, wherein the first state control signal defines a state of at least one circuit component.

3. The voltage monitoring circuit as claimed in claim 1, wherein the voltage monitoring circuit is configured to store the first state bit and the second state bit as redundant information.

4. The voltage monitoring circuit as claimed in claim 3, wherein the logic is configured, on determining that the first state bit and the second state bit contain non-redundant information, to output the second reset signal with a first value which results in a reset of the registers.

5. The voltage monitoring circuit as claimed in claim 1, wherein the first register and the second register are configured to store the first state bit with the same bit value as the second state bit.

6. The voltage monitoring circuit as claimed in claim 1, wherein the first register and the second register are configured to store the first state bit with a bit value opposite to the second state bit.

7. The voltage monitoring circuit as claimed in claim 1, wherein a switchover probability of the first register and/or the second register in the event of an irregularity of the voltage differs depending on the stored bit value.

8. The voltage monitoring circuit as claimed in claim 1, further comprising:
a third register configured to store a third state bit, ands coupled to the voltage to be monitored;
a fourth register connected in parallel to the third register, redundant in relation to the third register, configured to store a fourth state bit, and coupled to the voltage to be monitored; and
a second logic coupled to the third register and to the fourth register and configured to determine, from the third state bit and the fourth state bit, a second state control signal and a third reset signal,
wherein the voltage monitoring circuit is further configured to feed the third reset signal to the OR logic on the input side, and
wherein the OR logic is configured to incorporate the third reset signal in the processing of the first reset signal and the second reset signal according to the OR operation.

9. The voltage monitoring circuit as claimed in claim 8, wherein the first state control signal and the second state control signal jointly define a state of at least one circuit component.

10. The voltage monitoring circuit as claimed in claim 1, further comprising:
a filter configured to activate the logic only if the storage of the first state bit and the second state bit is completed.

11. A voltage monitoring circuit, comprising:
an analog reset signal generator configured to generate a reset signal, and coupled to a voltage to be monitored;
a first register configured to store a first state bit, and coupled to the voltage to be monitored;
a second register connected in parallel to the first register, redundant in relation to the first register, configured to store a second state bit, and coupled to the voltage to be monitored;
a logic coupled to the first register and to the second register, and configured to determine a second reset signal from the first state bit and the second state bit;
at least one state register configured to store at least one additional state bit, and generate at least one state control signal, and is coupled to the voltage to be monitored; and
an OR logic configured to receive the following signals on the input side and processes them with one another according to an OR operation: a first reset signal generated by the analog reset signal generator, and the second reset signal, so that a reset control signal is generated and fed to reset inputs of the registers and of the at least one state register.

12. The voltage monitoring circuit as claimed in claim 11, wherein the voltage monitoring circuit is configured to store the first state bit and the second state bit as redundant information.

13. The voltage monitoring circuit as claimed in claim 12, wherein the logic is configured, on determining that the first state bit and the second state bit contain non-redundant information, to output the second reset signal with a first value which results in a reset of the registers.

14. The voltage monitoring circuit as claimed in claim 11, wherein a switchover probability of the first register and/or the second register in the event of an irregularity of the voltage is higher than a switchover probability of the at least one state register.

15. The voltage monitoring circuit as claimed in claim 14, wherein the switchover probability of the first register and/or the second register is set by means of their input assignment as higher than the switchover probability of the at least one state register.

16. A method for monitoring a voltage, comprising:
if required, generating a reset signal in an analog reset signal generator which is coupled to a voltage to be monitored;
storing a first state bit in a first register, wherein the first register is coupled to the voltage to be monitored;
storing a second state bit in a second register connected in parallel to the first register and redundant in relation to the first register, wherein the second register is coupled to the voltage to be monitored;
determining a state control signal and a second reset signal, from the first state bit and the second state bit; and
processing according to an OR operation a first reset signal generated by the analog reset signal generator, and the second reset signal,
generating a reset control signal based on the OR operation; and
feeding the reset control signal to reset inputs of the registers.

17. A method for monitoring a voltage, comprising:
if required, generating a reset signal in an analog reset signal generator which is coupled to a voltage to be monitored;
storing a first state bit in a first register which is coupled to the voltage to be monitored;
storing a second state bit in a second register connected in parallel to the first register and redundant in relation to the first register, wherein the second register is coupled to the voltage to be monitored;
determining a second reset signal from the first state bit and the second state bit;
storing at least one additional state bit and generating at least one state control signal in at least one state register, wherein the at least one state register is coupled to the voltage to be monitored; and
processing according to an OR operation a first reset signal generated by the analog reset signal generator, and the second reset signal;
generating a reset control signal based on the OR operation; and
feeding the reset control signal to reset inputs of the registers and of the at least one state register.

* * * * *